(12) United States Patent
Liao et al.

(10) Patent No.: US 9,244,112 B2
(45) Date of Patent: Jan. 26, 2016

(54) METHOD FOR DETECTING AN ELECTRICAL DEFECT OF CONTACT/VIA PLUGS

(71) Applicant: MACRONIX International Co., Ltd., Hsinchu (TW)

(72) Inventors: Hsiang-Chou Liao, Hsinchu (TW); Tuung Luoh, Hsinchu (TW); Ling-Wuu Yang, Hsinchu (TW); Ta-Hone Yang, Hsinchu (TW); Kuang-Chao Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 81 days.

(21) Appl. No.: 14/275,437

(22) Filed: May 12, 2014

(65) Prior Publication Data

US 2015/0323583 A1    Nov. 12, 2015

(51) Int. Cl.
*H01L 21/66* (2006.01)
*G01R 31/04* (2006.01)
*H01J 37/22* (2006.01)
*H01J 37/244* (2006.01)
*H01J 37/28* (2006.01)
*G01R 31/305* (2006.01)

(52) U.S. Cl.
CPC .............. *G01R 31/04* (2013.01); *G01R 31/305* (2013.01); *H01J 37/222* (2013.01); *H01J 37/244* (2013.01); *H01J 37/28* (2013.01); *H01J 2237/049* (2013.01); *H01J 2237/063* (2013.01); *H01J 2237/221* (2013.01); *H01J 2237/24592* (2013.01); *H01J 2237/28* (2013.01)

(58) Field of Classification Search
CPC .............................. G01R 31/04; G01R 31/305
USPC ............................................................. 438/17
See application file for complete search history.

(56) References Cited

U.S. PATENT DOCUMENTS

| | | | | | |
|---|---|---|---|---|---|
| 5,962,867 | A | * | 10/1999 | Liu ......................... | H01L 22/34 257/369 |
| 2003/0001598 | A1 | * | 1/2003 | Weiner ................. | G01R 31/307 324/754.22 |
| 2008/0237586 | A1 | * | 10/2008 | Sun ......................... | H01L 22/32 257/48 |

* cited by examiner

*Primary Examiner* — Bradley K Smith
(74) *Attorney, Agent, or Firm* — J.C. Patents (57) ABSTRACT

A method for detecting an electrical defect of contact/via plugs is provided. In the method, the contact/via plugs are monitored by an electron-beam (E-Beam) inspection tool to capture an image with a VC (voltage contrast) difference, and then an image extraction is performed on the image with the VC difference, wherein the image extraction is based on Target gray level/back ground gray level. The extracted image is contrasted with a layout design base to obtain a blind contact or Quasi-blind issue of contact/via plugs. A grayscale value of the VC difference having the blind contact or Quasi-blind issue is compared with a determined range of grayscale value to determine whether the VC difference is abnormal.

22 Claims, 7 Drawing Sheets

601　　　　　　　　Defect　　　　　　　602

FIG. 6A

601　　　　　　　　Defect　　　　　　　602

FIG. 6B

METHOD FOR DETECTING AN ELECTRICAL DEFECT OF CONTACT/VIA PLUGS

BACKGROUND OF THE INVENTION

1. Field of the Invention

The invention relates to an analytical technique of a chip, and more particularly, to a method for detecting an electrical defect of contact/via plugs.

2. Description of Related Art

Die to die inspection is widely used inspection methodology, this method is to capture the defective optical, SEM or patch image in inspecting die and then compare with the other die reference image at the exactly same location in real time. However, as the technology node shrinks to 40 nm and beyond, it is hard to use large inspection field to inspect the tiny defects in electron beam (E-beam) inspection.

The E-Beam inspection (EBI) tool is currently used to obtain the image of the surface structure of a chip. Voltage contrast (VC) inspection in EBI is widely utilized to capture electrical defects of contact/via plugs. The monitoring of VC variations in the via plugs are more complicated than that of contact plugs because the via plugs layout structure connecting with different pitches, length metal lines and metallic layers.

Therefore, it needs to develop method for the technology node shrinkage.

SUMMARY OF THE INVENTION

The invention provides a method for detecting an electrical defect of contact/via plugs.

The invention further provides a method for detecting an electrical defect of contact/via plugs so as to avoid misalignment issue.

An exemplary embodiment of the present invention includes a method for detecting an electrical defect of contact/via plugs. In the method, the contact/via plugs are monitored by an electron-beam (E-Beam) inspection tool to capture an image with a VC (voltage contrast) difference, and then an image extraction is performed on the image with the VC difference, wherein the image extraction is based on target gray level/back ground gray level. The extracted image is contrasted with a layout design base to obtain a blind contact or Quasi-blind issue of the contact/via plugs. A grayscale value of the VC difference having the blind contact or Quasi-blind issue is compared with a determined range of grayscale value to determine whether the VC difference is abnormal.

In one embodiment of the invention, a pixel size of the E-Beam inspection tool is less than 0.1 µm.

Another exemplary embodiment of the present invention includes a method for detecting an electrical defect of contact/via plugs. In the method, a hot spot inspection, a leap and scan inspection, or a continuous scan inspection is used to monitor the contact/via plugs for capturing a VC difference, and then an image extraction is performed on the image with the VC difference, wherein the image extraction is based on target ground/back ground gray level. The extracted image is contrasted with a layout database to obtain a blind contact or Quasi-blind issue of the contact/via plugs. A grayscale value of the VC difference having the blind contact or Quasi-blind issue is compared with a predetermined range of grayscale value to determine whether the VC difference is abnormal.

In another embodiment of the invention, the hot spot inspection, the leap and scan inspection, and the continuous scan inspection each comprise locating same coordinates in a design chip with different dies.

In another embodiment of the invention, the contact/via plugs are both at periphery and array circuits of the different dies, and the periphery circuit is around the array circuit.

In another embodiment of the invention, a pixel size of the hot spot inspection is less than 0.1 µm.

In another embodiment of the invention, a pixel size of the leap and scan inspection is less than 0.1 µm.

In another embodiment of the invention, a pixel size of the continuous scan inspection is less than 0.1 µm.

In one embodiment of the invention, the image extraction further comprises revising tone of the captured image.

In each embodiment of the invention, the extracted image may be a semi-circular image, a reduced image, or nothing.

In each embodiment of the invention, the predetermined range of grayscale value is between 55 and 130.

In each embodiment of the invention, the layout design base includes a layout containing conductive lines under the contact/via plugs. The predetermined range of grayscale value is dependent on different size of the conductive lines connected to the contact/via plugs, wherein the size of the conductive lines contains length, width, area or pitch thereof.

In each embodiment of the invention, the image extraction is utilized to obtain contours of the conductive lines under the contact/via plugs.

Based on the above, according to the invention, the electrical defect of contact/via plugs may be correctly determine, even the Quasi-blind issue. Moreover, the hot spot inspection of the invention is excellent in alignment performance and sensitivity.

It is to be understood that both the foregoing general description and the following detailed description are exemplary, and are not intended to limit the scope of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
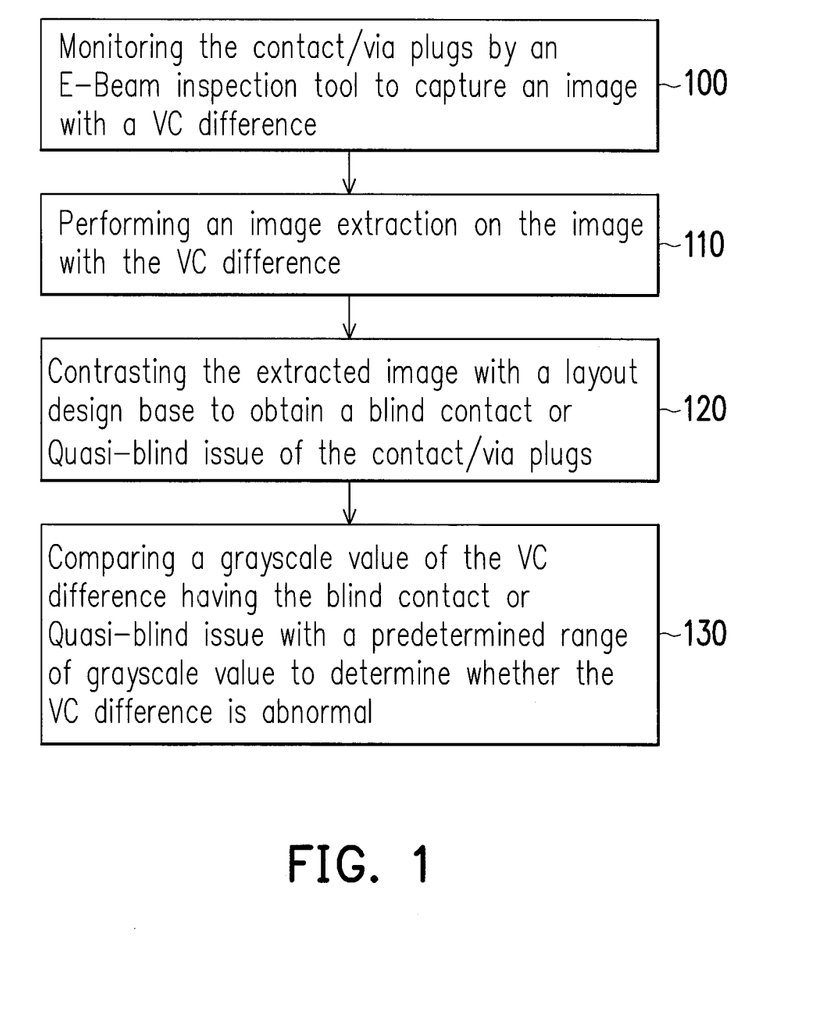
FIG. 1 is a flowchart of detecting an electrical defect of contact/via plugs according to the first embodiment of the invention.

FIG. 1 is a flowchart of detecting an electrical defect of contact/via plugs according to the first embodiment of the invention.

In step 100, the contact/via plugs are monitored by an electron-beam (E-Beam) inspection tool to capture an image with a VC difference in the contact/via plugs. In the embodiment, a pixel size of the E-Beam inspection tool may be less than 0.1 µm. For example, the small pixel size may be accomplished by using narrower aperture to converge the electron beam. The generation of the VC differences is affected by the electrical field condition caused by the surface charging voltage. For example, when the E-beam is emitted on the surface of each contact/via plug, the numbers of secondary electrons are different between the normal contact/via plugs and blind contact/via plugs. Under positive charged mode condition, the brightness of a SEM image at defective contact/via plugs become darker than that of a normal contact/via plug. On the contrary, if two neighboring contact/via plugs suffer the short and leakage issue, it will become brighter than that of normal contact/via plug.

Figure 2A:
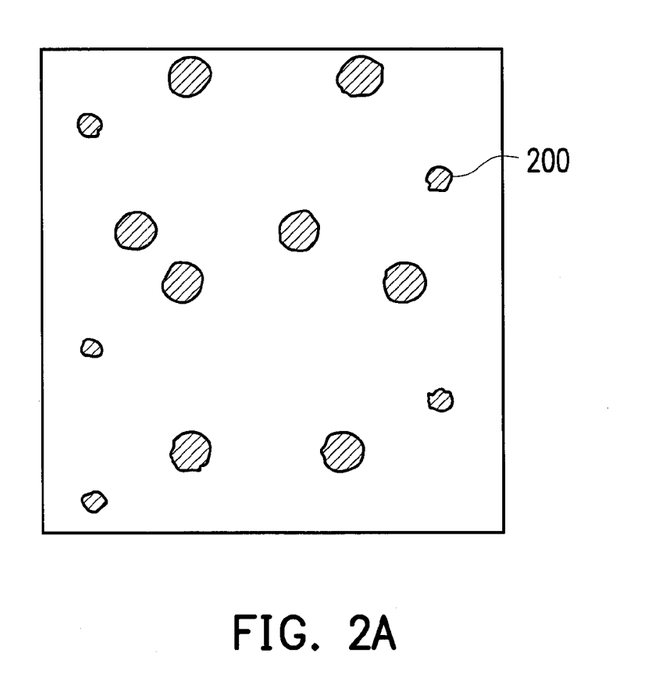
FIG. 2A illustrates the contours of normal contact/via plugs.
Figure 2B:
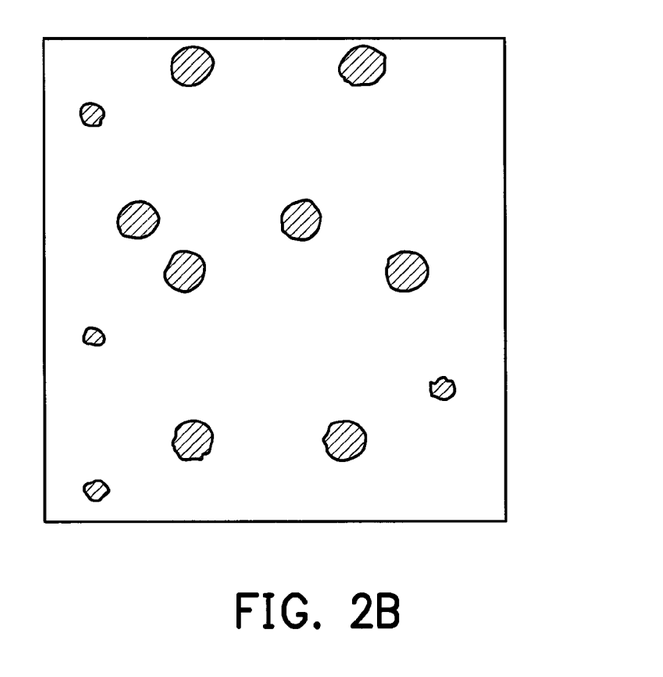
FIG. 2B illustrates the contours of abnormal contact/via plugs.

After the step 110, in step 110, an image extraction is performed on the image with the VC difference. The image extraction is based on target gray level/back ground gray level. Moreover, if necessary, the image extraction further includes revising tone of the captured image in the step 100. Since the image extraction can extract a contour of extracted image, the contact/via type can be judged by the contours thereof. If the extracted image is a semi-circular image, a reduced image or nothing, it could be regarded as abnormal contact/via plug. For example, through the image extraction, the blind contact/via plugs shows nothing, and the dark (i.e. defective contact/via plugs) is small. FIG. 2A illustrates the contours of normal contact/via plugs, and FIG. 2B illustrates the contours of abnormal contact/via plugs. It is noted that the contact/via plug 200 in FIG. 2A does not appear in FIG. 2B, there is a blind contact/via plug in FIG. 2B.

In the embodiment, an instrument may be utilized to perform the image extraction, such as a critical dimension scanning electron microscope (CD-SEM), an electron-beam (E-Beam) inspection tool, a bright-field inspection tool with wavelength 150-800 nm, or a dark-field inspection tool with laser light source. The method of the image extraction, for example, includes Edge contour extraction, Self-Affine mapping system, Self-Affine snake model, Active contour model, expectation-maximisation algorithm, Principal component analysis, Level set algorithm, or Monte Carlo techniques.

Figure 3A:
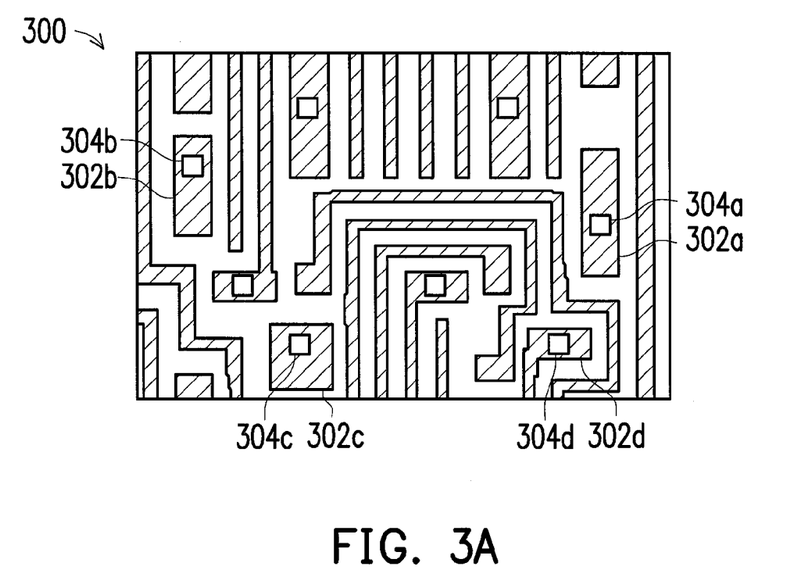
FIG. 3A is a layout containing metal lines under via plugs.
Figure 3B:
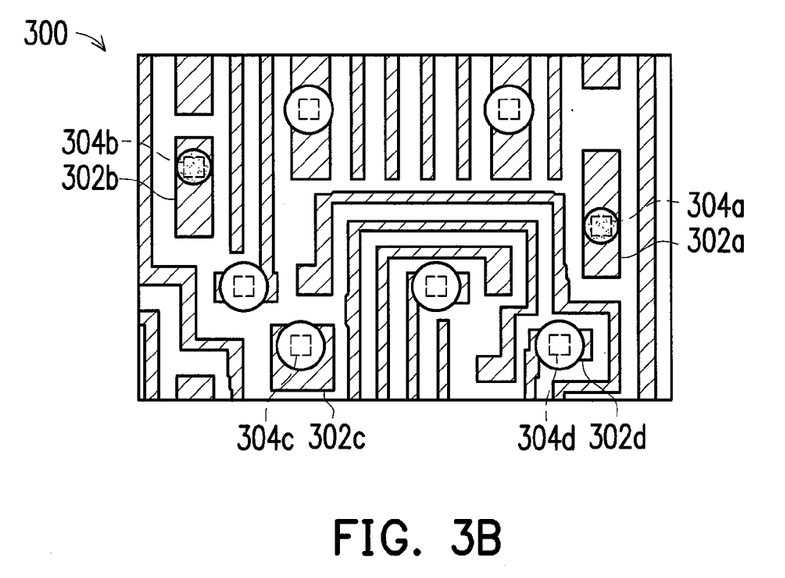
FIG. 3B illustrates the VC of the via plugs in FIG. 3A.

Thereafter, in step 120, the extracted image is contrasted with a layout design base to obtain a blind contact or Quasi-blind issue of the contact/via plugs. For example, the layout design base comprises a layout containing conductive lines under the contact/via plugs. In addition, the image extraction is performed on the conductive lines under the contact/via plugs to obtain their contours. According to research from the invention, it is found that the VC of each contact/via plug is dependent on its located environment. For example, in FIG. 3A, it demonstrates the layout 300 containing metal lines 302*a-d* under via plugs 304*a-d*, and the via plugs 304*a-d* are located at metal lines 302*a-d* with different length. FIG. 3B illustrates that the via plugs 304*a-b* located at short metal lines 302*a-b* show much lower VC than that of located at large-area metal line 302*c* or long-stripe metal line 302*d*. Therefore, the VC of the via plugs 304*a-b* is lower than that of the via plugs 304*c-d*. In other words, with aid of contact/via layout design base and the image extraction, the blind contact or Quasi-blind issue becomes easier to distinguish according the correlation of via plug locations. Except for length or area of the metal lines 302*a-d*, width or pitch of the metal lines may be also utilized to distinguish the blind contact or Quasi-blind issue. Moreover, if the plugs are contact plugs, the conductive lines may be poly-Si lines or other conductive lines.

Thereafter, in step 130, a grayscale value of the VC difference having the blind contact or Quasi-blind issue is compared with a determined range of grayscale value to determine whether the VC difference is abnormal. The determined range of grayscale value may be varied according to different size of the conductive lines connected to the contact/via plugs as above conclusion. The size of the conductive lines contains at least one of length, width, area and pitch thereof, for example. In the embodiment, the determined range of grayscale value is between 55 and 130 for finding the so-called Quasi-Blind issue. By contrast, the blind grayscale is 0-40 in general.

Furthermore, the first embodiment may be applied to find the contact defect under the via plugs. For example, in FIG. 4A, it shows that a layout 400 contains metal lines 402 under via plugs 404, and the contact plugs 406 under the metal lines 402. In the layout 400, there are three sites 408*a-c* with via plugs and contact plugs.

Figure 4A:
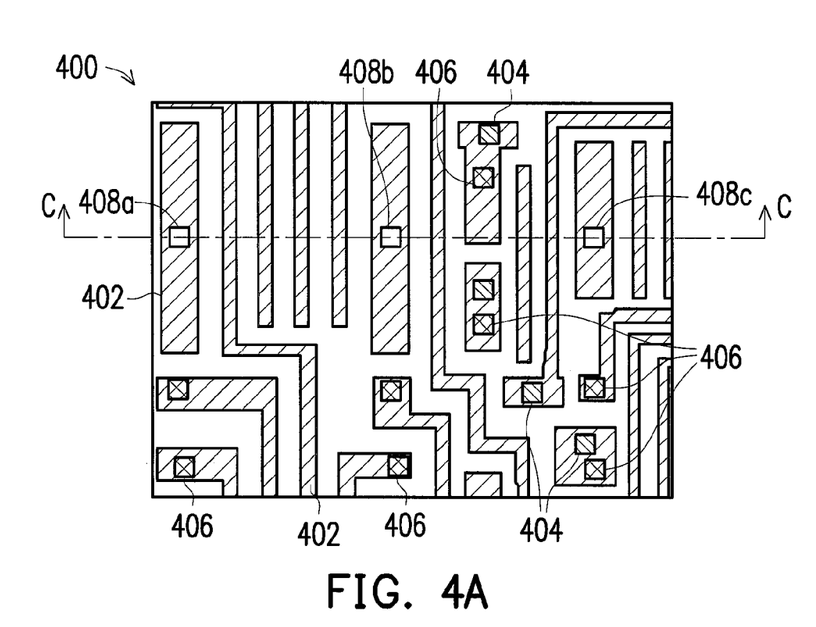
FIG. 4A shows a layout contains metal lines under via plugs according to an example of the first embodiment.
Figure 4B:
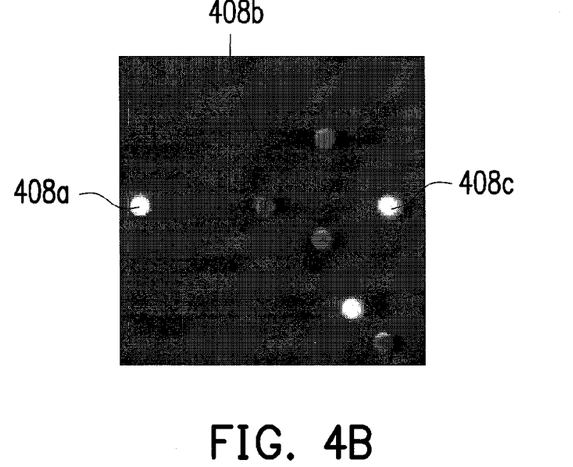
FIG. 4B shows the VC differences of a chip after forming the via plugs of FIG. 4A.
Figure 4C:
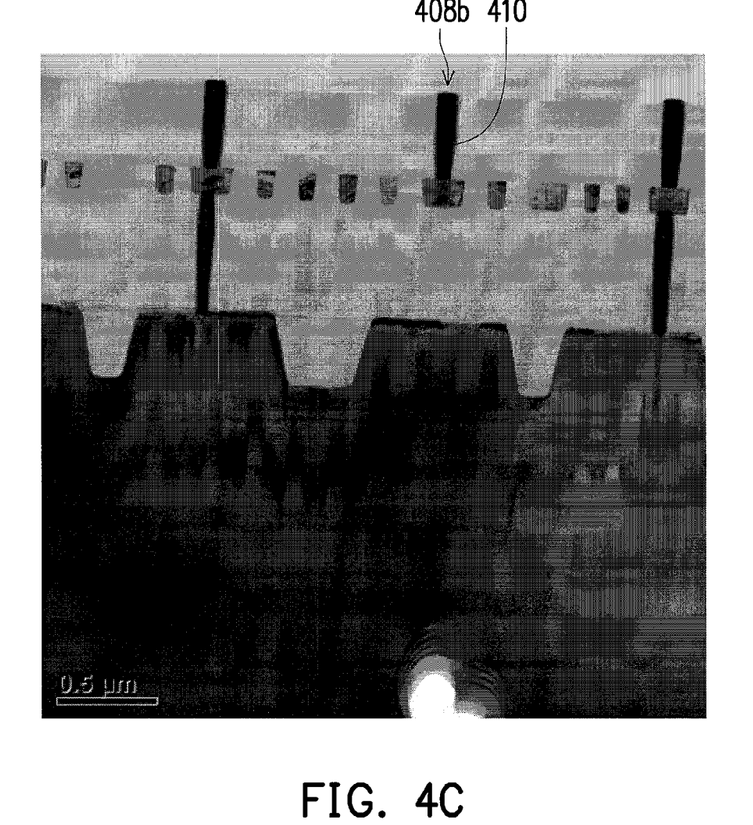
FIG. 4C is a FIB (Focused Ion Beam) image illustrating the via plugs and the contact plugs along line C-C in FIG. 4A.

FIG. 4B shows the VC differences of a chip after forming the via plugs 404 of FIG. 4A. Because the via plugs in the site 408*b* is located at long metal line 402, the VC at the site 408*b* should be similar to that at the sites 408*a* and 408*c*. However, the site 408*b* is darker than the site 408*a* or 408*c*. After FIB verifies that the via plug 410 at the site 408*b* is normal but the contact plug which connecting with the via plug 410 is missing, as shown in FIG. 4C.

Figure 5:
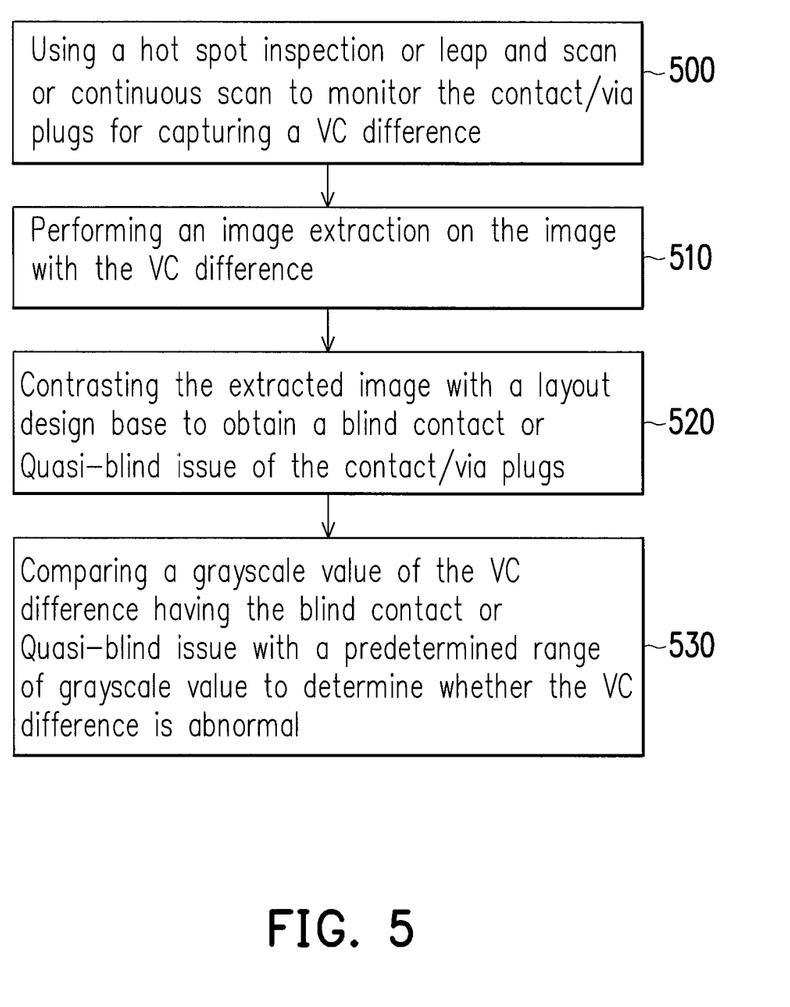
FIG. 5 is a flowchart of detecting an electrical defect of contact/via plugs according to the second embodiment of the invention.

FIG. 5 is a flowchart of detecting an electrical defect of contact/via plugs according to the second embodiment of the invention.

Figure 6A:
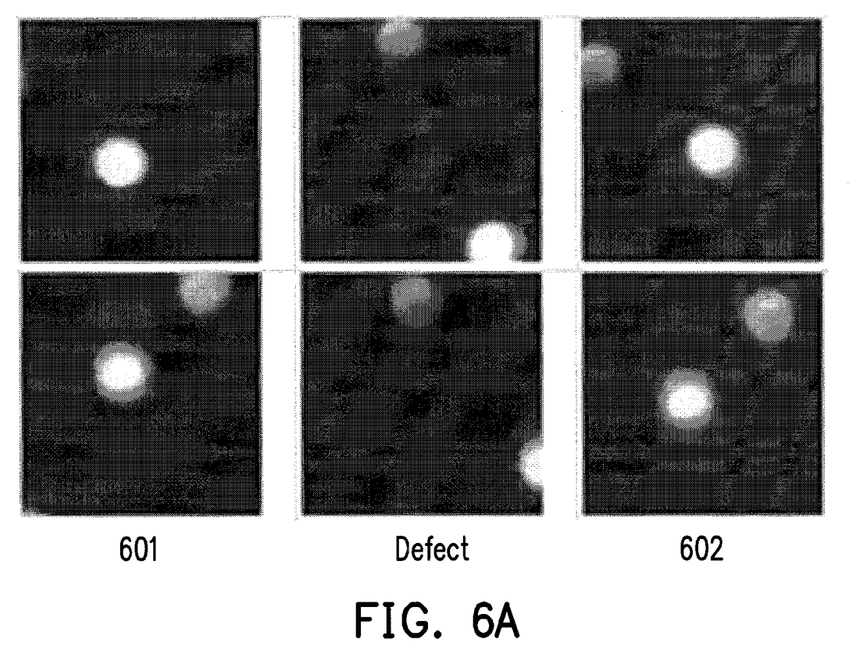
FIG. 6A shows an image obtained by leap & scan with positive mode.

In step 500, the contact/via plugs are monitored by using a hot spot inspection, a leap and scan inspection, or a continuous scan inspection, whereby capturing a VC difference in the contact/via plugs. A pixel size of the hot spot inspection, the leap and scan inspection, and the continuous scan inspection may be less than 0.1 λm for instance. For example, the small pixel size may be accomplished by using narrower aperture to converge the electron beam. The hot spot inspection, the leap and scan inspection, and the continuous scan inspection may respectively comprise the step of locating same coordinates (x, y) in a design chip with different dies. In particular, the contact/via plugs may be both at periphery and array circuits of the different dies, and the periphery circuit is around the array circuit. Since it will suffer serious misalignment issue by using the continuous or leap and scan traditional E-beam inspection mode with higher resolution and small inspection field, as shown in FIG. 6A. FIG. 6A shows that leap and scan inspection with positive mode and external electric field has misalignment issue in the large inspection field 1536×1536 inspection field with pixel 7 nm, and it is hard to achieve better die to die inspection in the periphery area. However, the hot spot inspection, the leap and scan inspection, and the continuous scan inspection in the step 500 can locate the exactly same (x, y) coordinates in the design chip with different die according the user definition. Therefore, it is not easy to have image misalignment issue during inspection even using high resolution pixel condition, as shown in FIG. 6B.

Figure 6B:
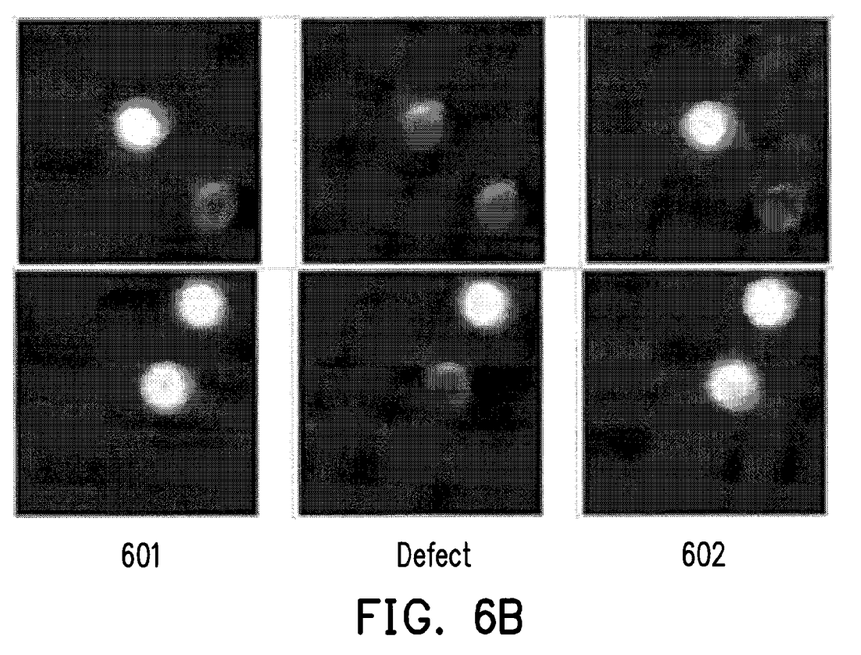
FIG. 6B shows an image obtained by the hot shot inspection of the second embodiment.

FIG. 6B demonstrates the hot spot inspection with small 1536×1536 inspection field and with 7 nm pixel resolution, and it shows that the VC differences are identified by comparing the reference die 601 and 602 with exactly same location.

In addition, after the step 510, an image extraction is performed on the image with the VC difference, as described in the first embodiment. The image extraction is based on target gray level/back ground gray level. The image extraction may include revising tone to enhance the VC difference in the step 500, if necessary.

Moreover, one type of VC is found by the hot spot inspection, this type of VC will become darker than normal one in the first scan, however, it will back to normal (bright) when do the 2nd inspection, that's named as quasi-blind VC in the embodiment. The quasi-blind VC in these via plugs are induced by the residue on the plug surface, and these residues may be W and/or O elements, for example. Hence, it is verified that the hot spot inspection can inspect the tiny variation of VC with high sensitivities.

In step 520, the extracted image is contrasted with a layout design base to obtain a blind contact or Quasi-blind issue of the contact/via plugs. For example, the layout design base comprises a layout containing conductive lines under the contact/via plugs, and the image extraction is utilized to obtain contours of the conductive lines under the contact/via plugs. As the same with the first embodiment, with aid of contact/via layout design base, the blind contact or Quasi-blind issue becomes easier to distinguish according the correlation of via plug locations.

Afterwards, in step 530, a grayscale value of the VC difference having the blind contact or Quasi-blind issue is compared with a determined range of grayscale value to determine whether the VC difference is abnormal. The determined range of grayscale value may be dependent on different size of the conductive lines connected to the contact/via plugs as above conclusion, wherein the "size" means at least one of length, width, area and pitch thereof, for example. Furthermore, the total grayscale value is 0-255, and the determined range of grayscale value is between 55 and 130 to find the Quasi-Blind issue.

Based on the above, in the method of the invention, the layout design base is used to obtain the blind contact or Quasi-blind issue, and thus it can determine the Quasi-Blind defects by the grayscale value accurately. In addition, the Hot Spot inspection, the Leap and Scan inspection, or the Continuous Scan inspection in the invention can resolve the misalignment issue, especially in the irregularly periphery area of a chip.

Although the present invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A method for detecting electrical defect of contact/via plugs, comprising:
    monitoring the contact/via plugs by an electron-beam (E-Beam) inspection tool to capture an image with a VC (voltage contrast) difference;
    performing an image extraction on the image with the VC difference, wherein the image extraction is based on target gray level/back ground gray level;
    contrasting the extracted image with a layout design base to obtain a blind contact or Quasi-blind issue of the contact/via plugs; and
    comparing a grayscale value of the VC difference having the blind contact or Quasi-blind issue with a predetermined range of grayscale value to determine whether the VC difference is abnormal.

2. The method of claim 1, wherein the extracted image comprises a semi-circular image, a reduced image, or nothing.

3. The method of claim 1, wherein a pixel size of the E-Beam inspection tool is less than 0.1 µm.

4. The method of claim 1, wherein the predetermined range of grayscale value is between 55 and 130.

5. The method of claim 1, wherein the layout design base includes a layout containing conductive lines under the contact/via plugs.

6. The method of claim 5, wherein the predetermined range of grayscale value is dependent on different size of the conductive lines connected to the contact/via plugs.

7. The method of claim 6, wherein the size of the conductive lines comprises length, width, area or pitch.

8. The method of claim 5, wherein the image extraction is utilized to obtain contours of the conductive lines under the contact/via plugs.

9. The method of claim 1, wherein the image extraction further comprises revising tone of the captured image with the VC difference.

10. A method for detecting electrical defect of contact/via plug, comprising:
    using a hot spot inspection, a leap and scan inspection, or a continuous scan inspection to monitor the contact/via plugs for capturing a VC difference;
    performing an image extraction on the image with the VC difference;
    contrasting the extracted image with a layout design base to obtain a blind contact or Quasi-blind issue of the contact/via plugs; and
    comparing a grayscale value of the VC difference having the blind contact or Quasi-blind issue with a predetermined range of grayscale value to determine whether the VC difference is abnormal.

11. The method of claim 10, wherein the hot spot inspection, the leap and scan inspection, and the continuous scan inspection each comprise locating same coordinates in a design chip with different dies.

12. The method of claim 11, wherein the contact/via plugs are both at periphery and array circuits of the different dies and the periphery circuit is around the array circuit.

13. The method of claim 10, wherein the extracted image comprises a semi-circular image, a reduced image, or nothing.

14. The method of claim 10, wherein a pixel size of the hot spot inspection is less than 0.1 µm.

15. The method of claim 10, wherein a pixel size of the leap and scan inspection is less than 0.1 µm.

16. The method of claim 10, wherein a pixel size of the continuous scan inspection is less than 0.1 µm.

17. The method of claim 10, wherein the predetermined range of grayscale value is between 55 and 130.

18. The method of claim 10, wherein the layout design base includes a layout containing conductive lines under the contact/via plugs.

19. The method of claim 18, wherein the predetermined range of grayscale value is dependent on different size of the conductive lines connected to the contact/via plugs.

20. The method of claim 19, wherein the size of the conductive lines comprises length, width, area, or pitch.

21. The method of claim 18, wherein the image extraction is utilized to obtain contours of the conductive lines under the contact/via plugs.

22. The method of claim 10, wherein the image extraction further comprises revising tone to enhance the VC difference.

* * * * *